United States Patent
Shen

(10) Patent No.: US 9,742,399 B2
(45) Date of Patent: Aug. 22, 2017

(54) PROPORTIONAL FEEDBACK FOR REDUCED OVERSHOOT AND UNDERSHOOT IN A SWITCHED OUTPUT

(71) Applicant: Cirrus Logic, Inc., Austin, TX (US)

(72) Inventor: Dan Shen, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 152 days.

(21) Appl. No.: 14/270,319

(22) Filed: May 5, 2014

(65) Prior Publication Data

US 2015/0318854 A1 Nov. 5, 2015

(51) Int. Cl.

| | |
|---|---|
| *H03F 3/217* | (2006.01) |
| *H03K 17/693* | (2006.01) |
| *H02J 1/06* | (2006.01) |
| *H03K 17/687* | (2006.01) |
| *H04R 3/00* | (2006.01) |
| *H02J 1/00* | (2006.01) |

(52) U.S. Cl.
CPC ............ *H03K 17/693* (2013.01); *H02J 1/06* (2013.01); *H03F 3/217* (2013.01); *H03F 3/2171* (2013.01); *H03K 17/6872* (2013.01); *H04R 3/00* (2013.01); *H02J 2001/008* (2013.01); *Y10T 307/549* (2015.04)

(58) Field of Classification Search
CPC ...... H03F 3/217; H03F 3/2173; H03F 3/2171; H03F 2200/351; H03F 2200/03; H03F 2200/78
USPC ............................................. 330/207 A, 251
See application file for complete search history.

(56) References Cited

U.S. PATENT DOCUMENTS

| | | | |
|---|---|---|---|
| 5,877,647 A | * 3/1999 | Vajapey | H03F 1/523 326/27 |
| 6,265,915 B1 | 7/2001 | Rider et al. | |
| 6,313,682 B1 | * 11/2001 | Muller, Jr. | H03K 17/667 327/291 |

(Continued)

FOREIGN PATENT DOCUMENTS

EP 0704974 A1 4/1996

OTHER PUBLICATIONS

Lynch, J.; Guide to Grammar and Style—A; https://andromeda.rutgers.edu/~jlynch/writing/a.html (retrieved Nov. 30, 2015), p. 1.

(Continued)

*Primary Examiner* — Khanh V Nguyen
(74) *Attorney, Agent, or Firm* — Jackson Walker L.L.P.

(57) ABSTRACT

Embodiments of apparatuses and methods for proportional feedback for reduced overshoot and undershoot in a switched output are described. An embodiment of an apparatus includes a switching output stage configured to receive an input signal and provide a responsive output signal. The apparatus may also include a pulling circuit coupled to one of the first switching device and the second switching device. The pulling circuit may pull a control voltage of power transistors in the switching output stage to reduce impedance of at least one of the transistors in response to a determination that the output signal at the common output node is outside of a predetermined range of a threshold value. Pulling strength may increase as a voltage difference between the output signal and one of the first supply voltage and the second supply voltage increases.

30 Claims, 6 Drawing Sheets

(56) References Cited

U.S. PATENT DOCUMENTS

| | | | | |
|---|---|---|---|---|
| 6,859,100 | B2* | 2/2005 | Ballan | H03F 1/52 |
| | | | | 330/255 |
| 7,154,332 | B2* | 12/2006 | Tsuchi | H03F 3/3022 |
| | | | | 330/255 |
| 7,649,414 | B2* | 1/2010 | Kaya | H03F 3/217 |
| | | | | 330/251 |
| 8,872,561 | B2* | 10/2014 | Shen | H03K 17/133 |
| | | | | 327/108 |
| 9,252,764 | B1* | 2/2016 | Shen | H03K 17/165 |
| 2008/0061876 | A1 | 3/2008 | Kaya et al. | |
| 2009/0174485 | A1* | 7/2009 | Teng | H03F 1/523 |
| | | | | 330/251 |
| 2010/0085118 | A1* | 4/2010 | Chiu | H03F 3/2171 |
| | | | | 330/251 |
| 2012/0014025 | A1* | 1/2012 | Sato | H03F 1/52 |
| | | | | 361/93.1 |

OTHER PUBLICATIONS

International Search Report and Written Opinion, International Patent Application No. PCT/US2015/029112, mailed Aug. 24, 2015, 12 pages.

\* cited by examiner

PROPORTIONAL FEEDBACK FOR REDUCED OVERSHOOT AND UNDERSHOOT IN A SWITCHED OUTPUT

FIELD

This disclosure relates generally to signal amplifiers, and, more specifically, to proportional feedback for reduced overshoot and undershoot in a switched output.

BACKGROUND

The present invention relates to a method and apparatus to reduce overshoot and undershoot voltages (e.g., spike voltages) in class D amplifiers and DC-DC converters like boost converter or buck converters.

High efficiency therefore low heat dissipation and long battery life can be achieved by using switched output stage in audio amplifiers like class D amplifiers. A Class D amplifier usually comprises of two switches, one is connected between power supply and output, another switch is connected between ground and output. By switching output either to power supply or ground, a string of high and low pulses are created at the output of class D amplifier, while a continuous output is constructed by filtering the class D amplifier output through a low pass filter, which can be implemented either explicitly or implemented within a load device like an audio speaker.

When using class D amplifier to drive a speaker, which can be deemed as a big inductive load, load current cannot change instantaneously. When both of the power switches are off, current can only go through the FET parasitic diode. Depending on the current direction, the parasitic diode can cause output to either be one diode-drop above power supply or one diode-drop below ground. When both of the power switches are on at the same time, shoot through current will cause power waste and large amounts of ringing at the output because of the abrupt change of current caused on parasitic inductance. Therefore, it is desirable to turn on the two switches in a switched output stage in a non-overlapped way but with overlap time as small as possible.

SUMMARY

Embodiments of apparatuses and methods for proportional feedback for reduced overshoot and undershoot (e.g., spike voltages) in a switched output are described. In an embodiment, an apparatus includes a switching output stage configured to receive an input signal and provide a responsive output signal between a first supply voltage and a second supply voltage. Additionally, the switching output stage may include a first switching device and a second switching device with a common output node. The first switching device may be coupled to the first supply voltage and the common output node. The second switching device may be coupled to the second supply voltage and the common output node. In an embodiment, the first supply voltage is higher than the second supply voltage. The apparatus may also include a pulling circuit coupled to one of the first switching device and the second switching device. The pulling circuit may pull a control voltage of one of the first switching device and the second switching device to reduce impedance of the one of the first switching device and the second switching device in response to a determination that the output signal at the common output node is either larger than a first predetermined threshold, which is close to the first supply, or lower than a second predetermined threshold, which is close to the second supply. Additionally, a pulling strength of the pulling circuit increases as output voltage increases in response to the output voltage being larger than the first predetermined threshold, and the pulling strength of the pulling circuit increases as output voltage decreases in response to the output voltage being lower than the second predetermined threshold.

In an embodiment, the pulling circuit may pull the control voltage of the first switching device to reduce the impedance of the first switching device in response to a determination that the output signal at the common output node is above a predetermined voltage and in response to a determination that the input signal indicates that output signal is changing from low to high. In another embodiment, the pulling circuit may pull the control voltage of the first switching device to reduce the impedance of the first switching device in response to a determination that the output signal at the common output node is below a predetermined voltage and in response to a determination that input signal indicates that output signal is changing from low to high.

In an embodiment, the pulling circuit may pull the control voltage of the second switching device to reduce the impedance of the second switching device in response to a determination that the output signal at the common output node is above a predetermined voltage, and in response to a determination that the input signal indicates that output signal is changing from high to low. In another embodiment, the pulling circuit may pull the control voltage of the second switching device to reduce the impedance of the second switching device in response to a determination that the output signal at the common output node is below a predetermined voltage, and in response to a determination that the input signal indicates that output signal is changing from high to low.

In one embodiment, the first switching device is a PMOS transistor, and the control voltage is at a gate node of the PMOS transistor, the second switching device is a NMOS transistor and the control voltage is at the gate node of the NMOS transistor. In another embodiment, the first switching device may be a NMOS transistor, and the control voltage is at a gate node of the NMOS transistor, the second switching device is another NMOS transistor and the control voltage is at the gate node of that NMOS transistor.

In an embodiment, the method includes receiving an input signal at a switching output stage, the switching output stage having a first switching device and a second switching device with a common output node, the first switching device being coupled to a first supply voltage and the common output node, and the second switching device being coupled to a second supply voltage and the common output node, the first supply voltage being higher than the second supply voltage. The method may also include providing a responsive output signal to the common output node between the first supply voltage and the second supply voltage. Additionally, the method may include pulling a control voltage of one of the first switching device and the second switching device to reduce impedance of the one of the first switching device and the second switching device in response to a determination that the output signal at the common output node is either larger than a first predetermined threshold, which is close to the first supply, or lower than a second predetermined threshold, which is close to the second supply, wherein a pulling strength of the pulling circuit increases as output voltage increases in response to the output voltage being larger than the first predetermined threshold, and the pulling strength of the pulling circuit increases as output voltage decreases in response to the output voltage being lower than the second predetermined threshold.

In an embodiment, pulling further comprises pulling the control voltage of the first switching device to reduce the impedance of the first switching device in response to a determination that the output signal at the common output node is above a predetermined voltage and in response to a determination that the input signal indicates that output signal is changing from low to high. In another embodiment, the pulling further comprises pulling the control voltage of the first switching device to reduce the impedance of the first switching device in response to a determination that the output signal at the common output node is below a predetermined voltage and in response to a determination that input signal indicates that output signal is changing from low to high.

In an embodiment, pulling further comprises pulling the control voltage of the second switching device to reduce the impedance of the second switching device in response to a determination that the output signal at the common output node is above a predetermined voltage, and in response to a determination that the input signal indicates that output signal is changing from high to low. In another embodiment, pulling further comprises pulling the control voltage of the second switching device to reduce the impedance of the second switching device in response to a determination that the output signal at the common output node is below a predetermined voltage, and in response to a determination that the input signal indicates that output signal is changing from high to low.

A system is also presented. In an embodiment, the system includes an acoustical driver configured to convert an electrical signal into acoustical energy. The system may also include a signal driver coupled to the acoustical driver. The signal driver may include a switching output stage configured to receive an input signal and provide a responsive output signal between a first supply voltage and a second supply voltage, the switching output stage having a first switching device and a second switching device with a common output node; the first switching device being coupled to the first supply voltage and the common output node, and the second switching device being coupled to the second supply voltage and the common output node, the first supply voltage being higher than the second supply voltage. Additionally, the signal driver may include a pulling circuit coupled to one of the first switching device and the second switching device, the pulling circuit configured to pull a control voltage of one of the first switching device and the second switching device to reduce impedance of the one of the first switching device and the second switching device in response to a determination that the output signal at the common output node is either larger than a first predetermined threshold, which is close to the first supply, or lower than a second predetermined threshold, which is close to the second supply, wherein a pulling strength of the pulling circuit increases as output voltage increases in response to the output voltage being larger than the first predetermined threshold, and the pulling strength of the pulling circuit increases as output voltage decreases in response to the output voltage being lower than the second predetermined threshold.

BRIEF DESCRIPTION OF THE DRAWINGS

The present disclosure is illustrated by way of example and is/are not limited by the accompanying figures, in which like references indicate similar elements. Elements in the figures are illustrated for simplicity and clarity and have not necessarily been drawn to scale.

DETAILED DESCRIPTION

Embodiments of apparatuses and methods for proportional feedback for reduced overshoot and undershoot in a switched output are described. Described embodiments may pull a control voltage of transistors in the switching output stage with a pulling circuit. The pulling circuit may reduce the impedance of at least one of the transistors in the switching output stage in response to a determination that the output signal at the common output node is outside of a predetermined range of a threshold value. Additionally, the pulling strength of the pulling circuit may increase as a voltage difference between the output signal and the respective rail voltages increases. Making the pulling strength proportional to overshoot or undershoot has a great benefit of reducing the high frequency components from the output overshoot and undershoot, therefore reducing the Electromagnetic Interference (EMI) from a class D amplifier significantly. Beneficially, such embodiments may reduce spike voltage amplitudes and EMI associated with over shoot and/or undershoot of the output signal as it switches from low to high, or from high to low.

Figure 1:
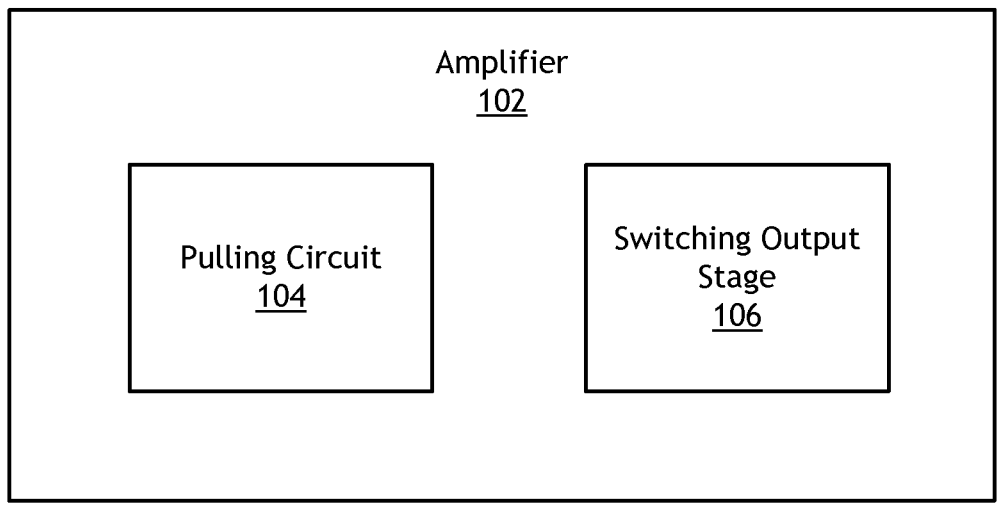
FIG. 1 is a schematic block diagram illustrating one embodiment of an apparatus for proportional feedback for reduced overshoot and undershoot in a switched output.

FIG. 1 is a schematic block diagram illustrating one embodiment of an apparatus for proportional feedback for reduced overshoot and undershoot in a switched output. In an embodiment, the apparatus comprises an amplifier 102. The amplifier 102 may include a switching output stage 106. Additionally, the amplifier may include a pulling circuit 104. In an embodiment, the switching output stage 106 may receive an input signal and provide a responsive output signal. In a particular embodiment, the switching output stage may include a first switching device and a second switching device with a common output node. The first switching device may be coupled to a first supply voltage and the common output node. The second switching device may be coupled to the second supply voltage and the common output node. In an embodiment, the first supply voltage is higher than the second supply voltage.

Figure 2A:
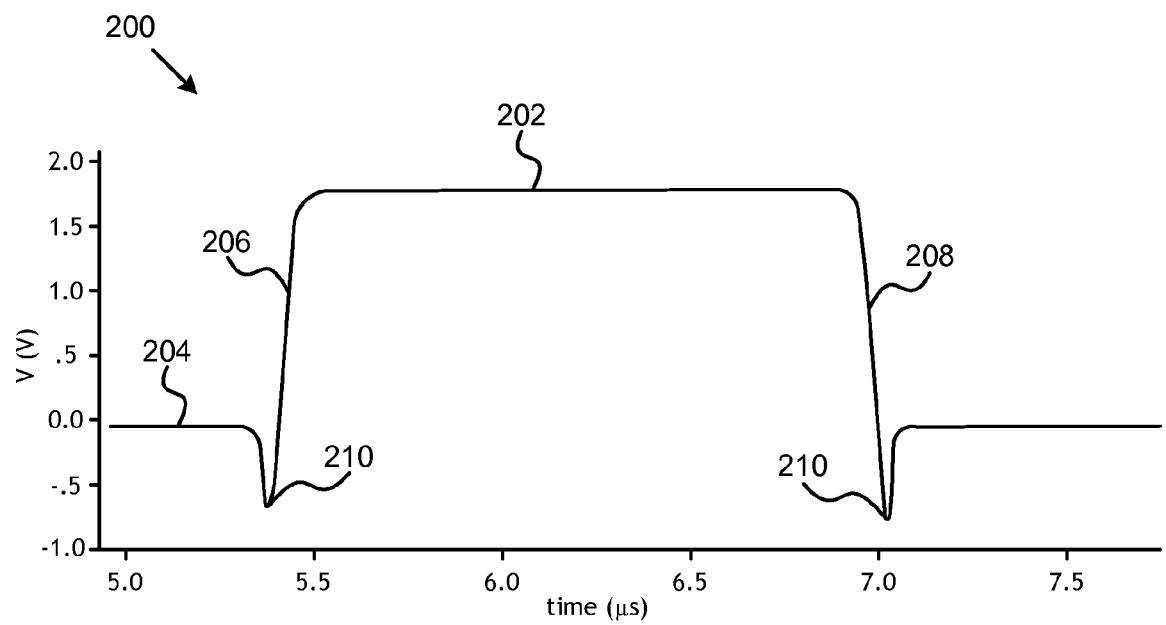
FIG. 2A is a diagram illustrating one embodiment of undershoot in a switching amplifier output.

FIG. 2A is a diagram illustrating one embodiment of undershoot in a switching amplifier output. FIG. 2A describes the case where the inductor current is at the output of the class D amplifier output. The output signal 200 may switch between a high rail voltage 202, such as Vdd, and a low rail voltage 204, such as ground. In the described embodiment, the high rail voltage 202 is at 1.8 V and the low rail voltage 204 is at ground. On the rising edge 206, when the output signal transitions from low to high, an undershoot 210 may occur during the non-overlap period when both power transistors in the switching output stage 106 are turned off. The non-overlap period is set to ensure that both power transistors are not turned on simultaneously. Similarly, an undershoot 210 may occur on the falling edge 208, when the output signal transitions from high to low.

Figure 2B:
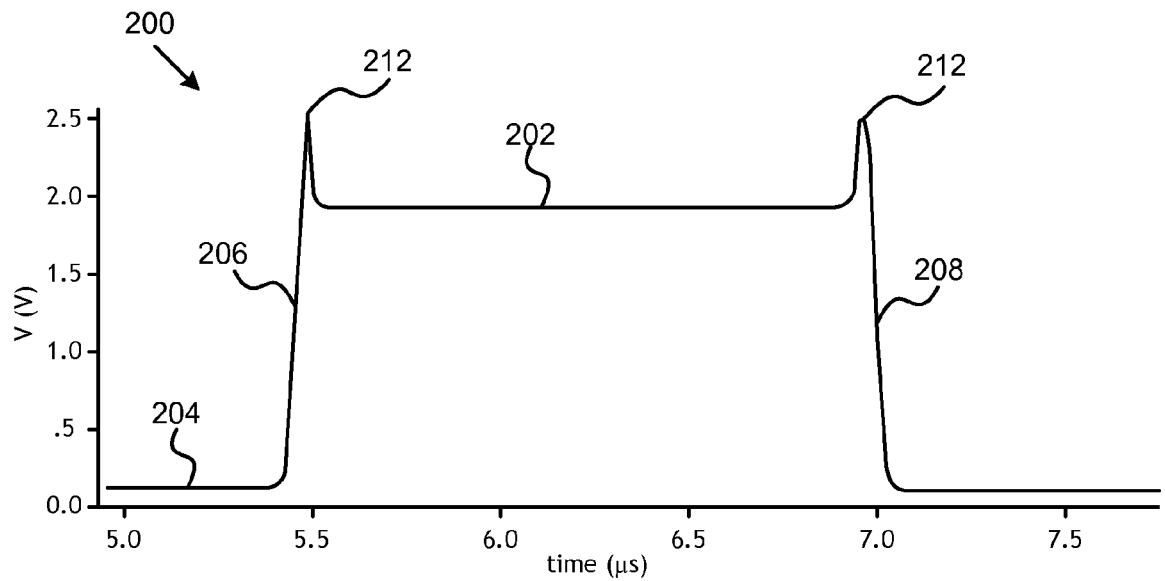
FIG. 2B is a diagram illustrating one embodiment of overshoot in a switching amplifier output.

FIG. 2B shows the case where the inductor load current is at the input of the switching output stage 106. FIG. 2B shows that overshoot 212 may occur on both the rising edge 206 and the falling edge 208 because of the non-overlap period when both power transistors in the switching output stage 106 are turned off.

It is desired that overshoot and undershoot shown in FIG. 2A and FIG. 2B be reduced or minimized for efficiency, EMI, and device reliability considerations. Reducing the non-overlapping time between the NMOS and PMOS switches will help, but runs the risks of turning both switches on together, that potentially creates a hazardous short situation between Vdd and ground.

Figure 3:
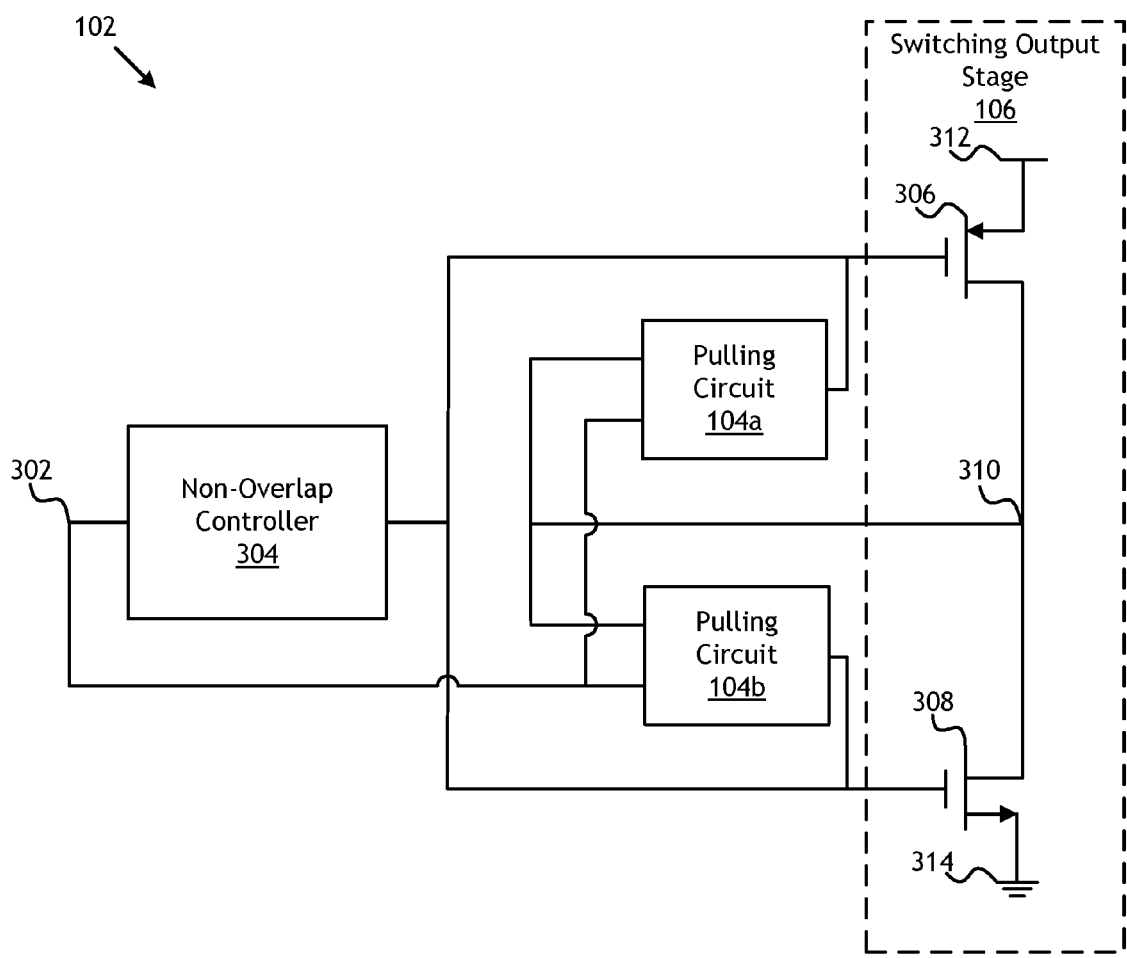
FIG. 3 is a schematic block diagram illustrating one embodiment of an apparatus for proportional feedback for reduced overshoot and undershoot in a switched output.

FIG. 3 illustrates a further example of an amplifier 102. In the depicted embodiment, the amplifier 102 receives a Pulse-Width Modulated (PWM) input signal 302 at a non-overlap controller 304. The non-overlap controller 304 is configured to provide PWM-responsive control signals to the switching output stage 106. In an embodiment, the switching output stage includes a first transistor 306 and a second transistor 308 arranged with a common output node 310. In a particular embodiment, the first transistor 306 may be Positive Metal-Oxide-Semiconductor (PMOS) Field-Effect Transistor (FET). In such an embodiment the second transistor 308 may be a complimentary Negative MOS (NMOS) FET. The first transistor 306 may be coupled to a first rail voltage 312, such as Vdd. The second transistor 308 may be coupled to a second rail voltage 314, such as ground.

Non-overlap controller 304 will ensure the first transistor 306 and the second transistor 308 will not be on at the same time. In an embodiment, gate control signals provided by the non-overlap controller 304 may be modified by a pulling circuit 104a and 104b. For example, pulling circuit 104a may receive the pwmin signal 302 as well as feedback from the common output node 310. For example, after pwmin 302 changes from low to high, the pulling circuit 104a may pull a control voltage of the first transistor 306 to reduce the impedance across the source-drain junction of the first transistor 306 if the output is either higher than a first predetermined threshold which is very close to the first power supply or if the output is lower than a second predetermined threshold voltage that is very close to the second power supply. The first threshold voltage is larger than the second threshold voltage. Additionally, pulling strength of the pulling circuit 104a may increase as the output signal on output node 310 increases if output signal on output node 310 is larger than the first threshold voltage. Pulling strength of the pulling circuit 304a may increase as the output signal 310 decreases if output signal is lower than the second threshold voltage. Making the pulling strength proportional to overshoot or undershoot has a great benefit of reducing the high frequency components from the output overshoot and undershoot, therefore reducing the EMI from a class D amplifier significantly.

Similarly, after pwmin signal 302 changes from high to low, pulling circuit 104b may reduce the impedance across the second transistor 308 in response to a determination that the output signal at the common output node 310 is either larger than a first predetermined threshold voltage or lower than a second predetermined threshold voltage. The pulling strength of the pulling circuit 104b may increase as the output signal on output node 310 increases if output signal 310 is larger than the first threshold voltage. Pulling strength of the pulling circuit 104a may increase as the output signal on output node 310 decreases if output signal is lower than the second threshold voltage.

In such embodiments, the pulling circuits 104a and 104b work together with the non-overlap controller 304. Pulling circuits 104a and 104b are only turned on where there is an overshoot or undershoot created by inductive load current. Therefore, pulling circuits 104a and 104b may reduce overshoot and/or undershoot of the rail voltages by reducing the impedances across the first transistor 306 and/or second transistor 308 as the voltage of output signal on output node 310 begins to exceed the rail voltage, while presenting no risk of creating shoot through current which is basically a short situation between supply voltage Vdd and ground.

Figure 4:
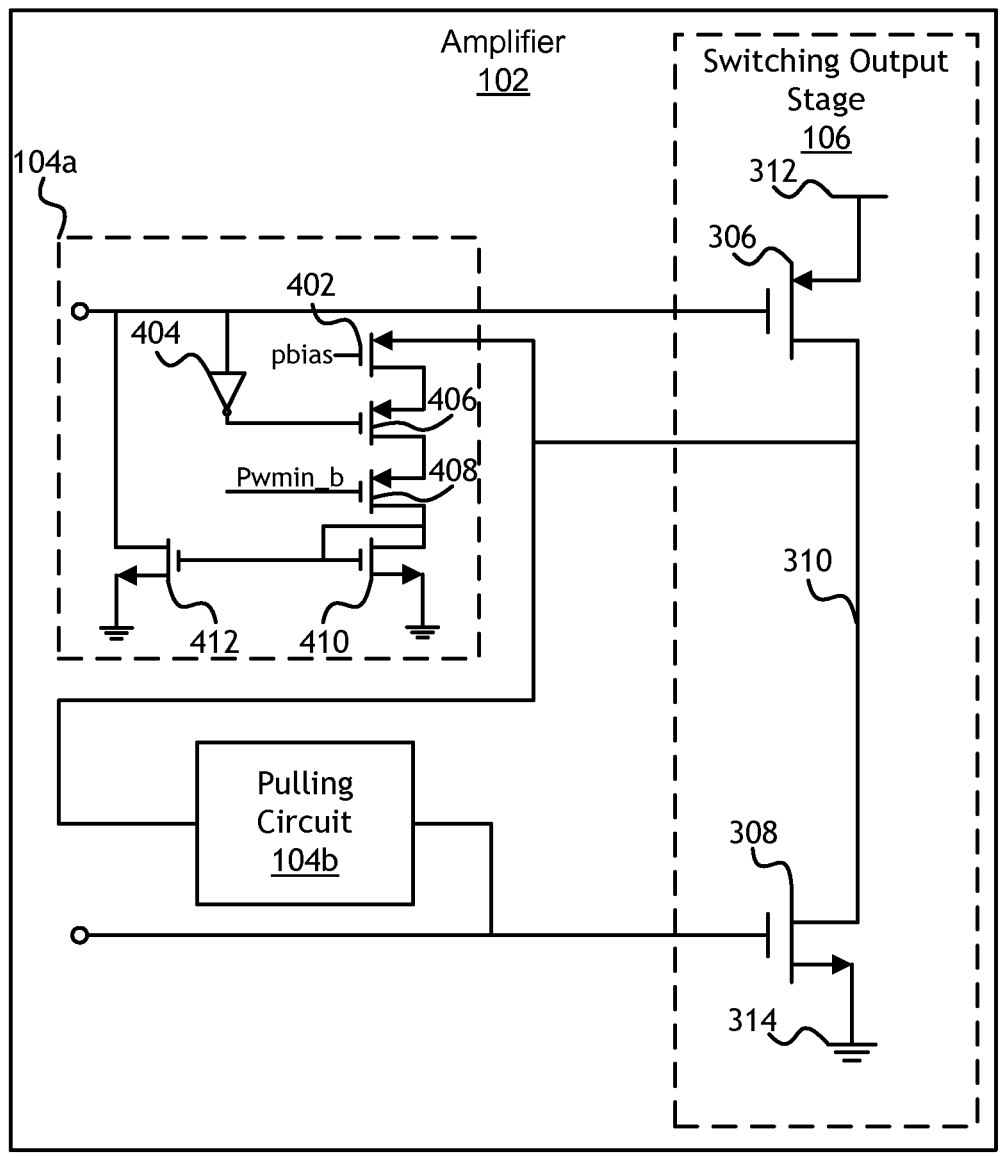
FIG. 4 is a schematic block diagram illustrating one embodiment of an apparatus for proportional feedback for reduced overshoot and undershoot in a switched output.

FIG. 4 shows an embodiment to reduce overshoot voltage at the rising edge 206 of an output signal, such as output signal 200 in FIGS. 2A-2B, for amplifier 102. Amplifier 102 may be a class D amplifier. In one embodiment, PMOS 402 may sense whether output voltage 200 is larger than a first predetermined threshold voltage. In one embodiment, the first predetermined threshold voltage may be roughly equal to the PMOS threshold voltage plus the pbias voltage at the gate node of PMOS 402. If the output voltage is less than the first predetermined voltage, no current may flow through PMOS 402. After the output voltage 200 rises above the first threshold voltage, current through PMOS 402 will increase as output voltage 200 increases because the source-gate voltage Vsg of the PMOS 402 will increase as output voltage 200 increases. Current in PMOS 402 may flow into NMOS 410 and then get mirrored by NMOS 412 to reduce the gate voltage of PMOS 306 to reduce the transistor impedance of PMOS 306. Gate of PMOS 408 is connected to the inverted pwmin_b signal to ensure sensing through PMOS 402 is only enabled after pwmin_b has changed from low to high. In one embodiment, inverter 404 and PMOS 406 are added to ensure that sensing is only done before the gate node of 306 is pulled down, so that this sensing branch does not consume any quiescent current when pwmin_b is at a steady value.

Figure 5:
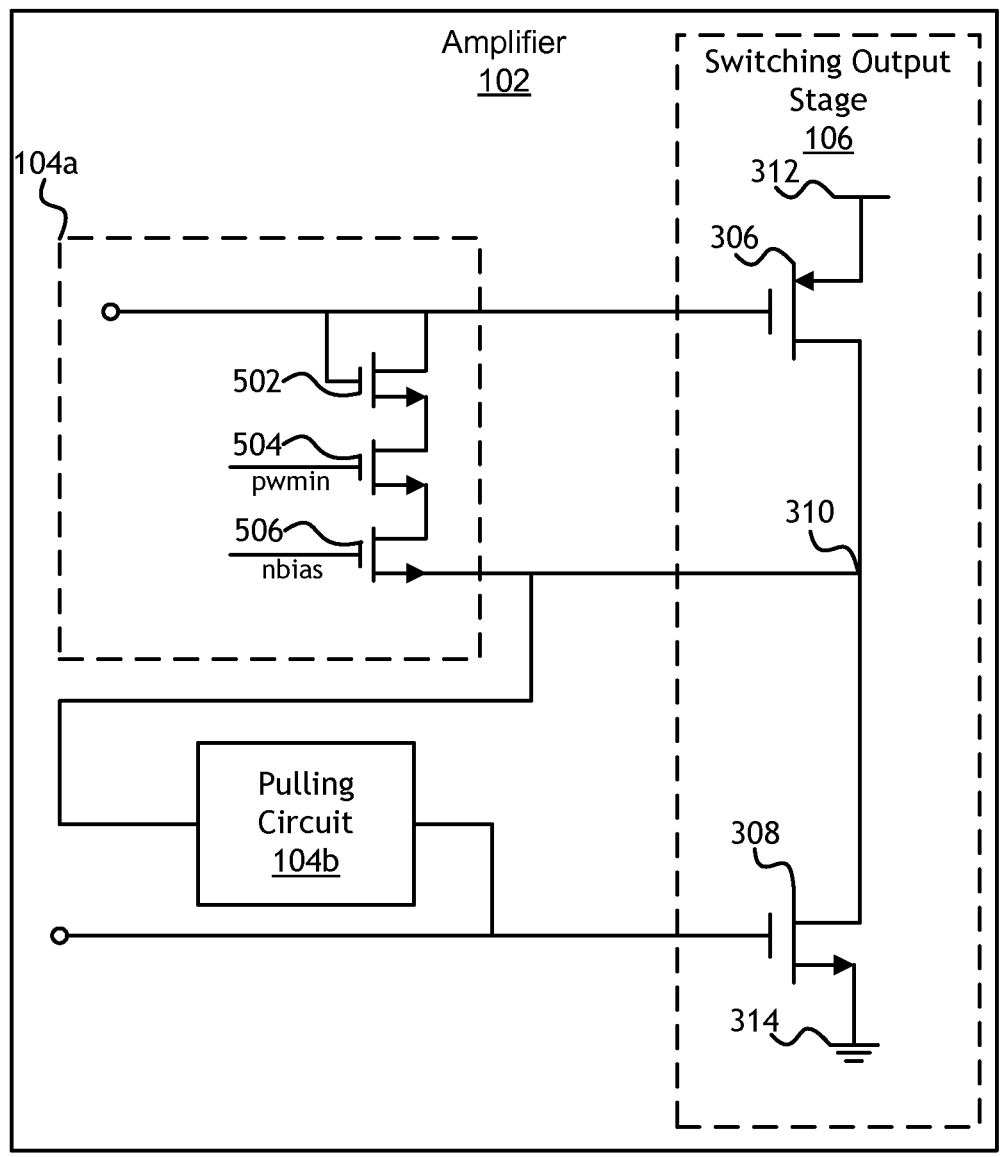
FIG. 5 is a schematic block diagram illustrating one embodiment of an apparatus for proportional feedback for reduced overshoot and undershoot in a switched output.

FIG. 5 shows an embodiment to reduce undershoot voltage at the rising edge of amplifier 102. As indicated before, amplifier 102 may be a class D amplifier. NMOS 502 will sense whether the output voltage 200 is below the second threshold voltage. The second threshold voltage may be roughly equal to nbias minus the NMOS threshold voltage. If the output voltage 200 is larger than the second predetermined voltage, no current will flow through NMOS 506. Once output voltage 200 has pulled lower than the second predetermined voltage by outgoing inductor current, current through NMOS 506 may increase as output voltage 200 decreases because gate-source voltage Vgs of NMOS 506 will increase as the output voltage 200 decreases. Current through NMOS 506 may pull down the gate voltage of PMOS 306 to reduce the impedance of PMOS 306 to prevent the output voltage from dropping below the low rail voltage 204 (which was referenced in FIGS. 2A and 2B). Gate of NMOS 504 may be coupled to pwmin signal, so that sensing through NMOS 506 is only enabled when pwmin has changed from low to high. NMOS 502 has its gate and drain connected to the gate of PMOS 306, while its source is connected to the drain of NMOS 504. Such embodiments may be useful to prevent backwards current from output to gate of PMOS 306 after the output voltage 200 has risen from low to high, and while the gate of PMOS 306 has fallen from high to low. Backwards current can waste energy, and may interrupt with normal function of the device.

Figure 6:
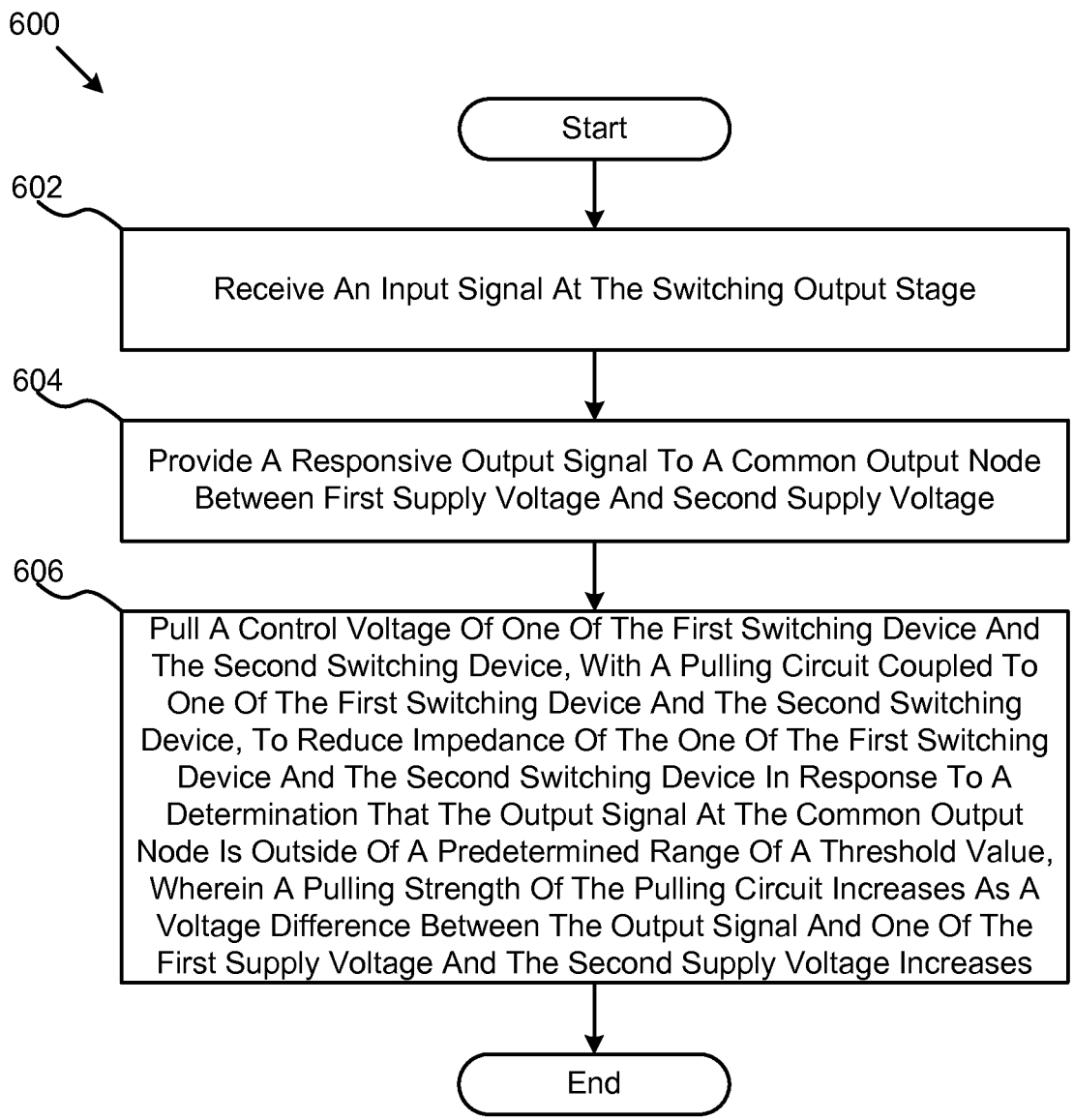
FIG. 6 is a flowchart diagram illustrating one embodiment of a method for using proportional feedback for reduced overshoot and undershoot in a switched output.

FIG. 6 is a flowchart diagram illustrating one embodiment of a method 600 for using proportional feedback for reduced overshoot 212 and undershoot 210 (that were previously referenced in FIGS. 2A and 2B) in a switched output stage 106. The method 600 includes at block 602, receiving an input signal at a switching output stage 106. The switching output stage 106 has a first switching device 306 and a second switching device 308 with a common output node 310. In one embodiment, the first switching device 106 is coupled to a first supply voltage 312 and the common output node 310. The second switching device 308 may be coupled to a second supply voltage 314 and the common output node 310, the first supply voltage 312 being higher than the second supply voltage 314.

In one embodiment, the method 600 may also include at block 604, providing a responsive output signal 200 to the common output node 310 between the first supply voltage 312 and the second supply voltage 314. Additionally, the method 600 may include at block 606, pulling a control voltage of one of the first switching device 306 and the second switching device 308 to reduce impedance of the one of the first switching device 306 and the second switching device 308 in response to a determination that the output signal 200 at the common output node 310 is either larger than a first predetermined threshold—as determined by pbias plus the PMOS threshold voltage in one embodiment—which is close to the first supply 313, or lower than a second predetermined threshold—as determined by nbias minus the NMOS threshold voltage in one embodiment—which is close to the second supply.

In one embodiment, the pulling strength of the pulling circuit 104 increases as output voltage increases 200 in response to the output voltage 200 being larger than the first predetermined threshold, and the pulling strength of the pulling circuit 104 increases as output voltage 200 decreases in response to the output voltage being lower than the second predetermined threshold. One benefit of the proportional pulling strength is that the overshoot or undershoot can be compensated for dynamically, increasing the speed of the overshoot/undershoot compensation and reducing the possibility of voltage oscillations.

Although this disclosure makes reference to specific embodiments, certain modifications and changes can be made to those embodiments. Accordingly, the specification and figures are to be regarded in an illustrative rather than a restrictive sense, and all such modifications are intended to be included within the scope of this disclosure. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. An apparatus for controlling spike voltage in a switching output stage, comprising:
   the switching output stage configured to receive an input signal and provide a responsive output signal between a first supply voltage and a second supply voltage, the switching output stage having a first switching device and a second switching device with a common output node;
   the first switching device being coupled to the first supply voltage and the common output node, and the second switching device being coupled to the second supply voltage and the common output node, the first supply voltage being higher than the second supply voltage; and
   a pulling circuit coupled to one of the first switching device and the second switching device, the pulling circuit configured to pull a control voltage of one of the first switching device and the second switching device to reduce impedance of the one of the first switching device and the second switching device in response to a determination that the output signal at the common output node is either larger than a first predetermined threshold, which is close to the first supply, or lower than a second predetermined threshold, which is close to the second supply;
   wherein a pulling strength of the pulling circuit increases as output voltage increases in response to the output voltage being larger than the first predetermined threshold, and the pulling strength of the pulling circuit increases as output voltage decreases in response to the output voltage being lower than the second predetermined threshold.

2. The apparatus of claim 1, wherein the pulling circuit is configured to pull the control voltage of the first switching device to reduce the impedance of the first switching device in response to a determination that the output signal at the common output node is above a predetermined voltage and in response to a determination that the input signal indicates that output signal is changing from low to high.

3. The apparatus of claim 1, wherein the pulling circuit is configured to pull the control voltage of the first switching device to reduce the impedance of the first switching device in response to a determination that the output signal at the common output node is below a predetermined voltage and in response to a determination that input signal indicates that output signal is changing from low to high.

4. The apparatus of claim 1, wherein the pulling circuit is configured to pull the control voltage of the second switching device to reduce the impedance of the second switching device in response to a determination that the output signal at the common output node is above a predetermined voltage, and in response to a determination that the input signal indicates that output signal is changing from high to low.

5. The apparatus of claim 1, wherein the pulling circuit is configured to pull the control voltage of the second switching device to reduce the impedance of the second switching device in response to a determination that the output signal at the common output node is below a predetermined voltage, and in response to a determination that the input signal indicates that output signal is changing from high to low.

6. The apparatus of claim 1, wherein the first switching device is a PMOS transistor, and the control voltage is at a gate node of the PMOS transistor, and the second switching device is a NMOS transistor, and the control voltage is at the gate node of the NMOS transistor.

7. The apparatus of claim 1, wherein the first switching device is a NMOS transistor, and the control voltage is at a gate node of the NMOS transistor, and the second switching device is another NMOS transistor, and the control voltage is at the gate node of that NMOS transistor.

8. A method, comprising:
receiving an input signal at a switching output stage, the switching output stage having a first switching device and a second switching device with a common output node, the first switching device being coupled to a first supply voltage and the common output node, and the second switching device being coupled to a second supply voltage and the common output node, the first supply voltage being higher than the second supply voltage;
providing a responsive output signal to the common output node between the first supply voltage and the second supply voltage; and
pulling a control voltage of one of the first switching device and the second switching device by a pulling circuit to reduce impedance of the one of the first switching device and the second switching device in response to a determination that the output signal at the common output node is either larger than a first predetermined threshold, which is close to the first supply, or lower than a second predetermined threshold, which is close to the second supply;
wherein a pulling strength of the pulling circuit increases as output voltage increases in response to the output voltage being larger than the first predetermined threshold, and the pulling strength of the pulling circuit increases as output voltage decreases in response to the output voltage being lower than the second predetermined threshold.

9. The method of claim 8, wherein pulling further comprises pulling the control voltage of the first switching device to reduce the impedance of the first switching device in response to a determination that the output signal at the common output node is above a predetermined voltage and in response to a determination that the input signal indicates that output signal is changing from low to high.

10. The method of claim 8, wherein pulling further comprises pulling the control voltage of the first switching device to reduce the impedance of the first switching device in response to a determination that the output signal at the common output node is below a predetermined voltage and in response to a determination that input signal indicates that output signal is changing from low to high.

11. The method of claim 8, wherein pulling further comprises pulling the control voltage of the second switching device to reduce the impedance of the second switching device in response to a determination that the output signal at the common output node is above a predetermined voltage, and in response to a determination that the input signal indicates that output signal is changing from high to low.

12. The method of claim 8, wherein pulling further comprises pulling the control voltage of the second switching device to reduce the impedance of the second switching device in response to a determination that the output signal at the common output node is below a predetermined voltage, and in response to a determination that the input signal indicates that output signal is changing from high to low.

13. The method of claim 8, wherein the first switching device is a PMOS transistor, and the control voltage is at a gate node of the PMOS transistor, the second switching device is a NMOS transistor and the control voltage is at the gate node of the NMOS transistor.

14. The method of claim 8, wherein the first switching device is a NMOS transistor, and the control voltage is at a gate node of the NMOS transistor, the second switching device is another NMOS transistor and the control voltage is at the gate node of that NMOS transistor.

15. A system, comprising:
an acoustical driver configured to convert an electrical signal into acoustical energy; and
a signal driver coupled to the acoustical driver, the signal driver comprising:
a switching output stage configured to receive an input signal and provide a responsive output signal between a first supply voltage and a second supply voltage, the switching output stage having a first switching device and a second switching device with a common output node;
the first switching device being coupled to the first supply voltage and the common output node, and the second switching device being coupled to the second supply voltage and the common output node, the first supply voltage being higher than the second supply voltage; and
a pulling circuit coupled to one of the first switching device and the second switching device, the pulling circuit configured to pull a control voltage of one of the first switching device and the second switching device to reduce impedance of the one of the first switching device and the second switching device in response to a determination that the output signal at the common output node is either larger than a first predetermined threshold, which is close to the first supply, or lower than a second predetermined threshold, which is close to the second supply;
wherein a pulling strength of the pulling circuit increases as output voltage increases in response to the output voltage being larger than the first predetermined threshold, and the pulling strength of the pulling circuit increases as output voltage decreases in response to the output voltage being lower than the second predetermined threshold.

16. The system of claim 15, wherein the pulling circuit is configured to pull the control voltage of the first switching device to reduce the impedance of the first switching device in response to a determination that the output signal at the common output node is above a predetermined voltage and in response to a determination that the input signal indicates that output signal is changing from low to high.

17. The system of claim 15, wherein the pulling circuit is configured to pull the control voltage of the first switching device to reduce the impedance of the first switching device in response to a determination that the output signal at the common output node is below a predetermined voltage and in response to a determination that input signal indicates that output signal is changing from low to high.

18. The system of claim 15, wherein the pulling circuit is configured to pull the control voltage of the second switching device to reduce the impedance of the second switching device in response to a determination that the output signal at the common output node is above a predetermined voltage, and in response to a determination that the input signal indicates that output signal is changing from high to low.

19. The system of claim 15, wherein the pulling circuit is configured to pull the control voltage of the second switching device to reduce the impedance of the second switching device in response to a determination that the output signal at the common output node is below a predetermined voltage, and in response to a determination that the input signal indicates that output signal is changing from high to low.

20. The system of claim 15, wherein the first switching device is a PMOS transistor, and the control voltage is at a gate node of the PMOS transistor, the second switching device is a NMOS transistor and the control voltage is at the gate node of the NMOS transistor.

21. The system of claim 15, wherein the first switching device is a NMOS transistor, and the control voltage is at a gate node of the NMOS transistor, the second switching device is another NMOS transistor and the control voltage is at the gate node of that NMOS transistor.

22. A method, comprising:
receiving an input signal at a switching output stage;
providing a responsive output signal to a common output node between a first supply voltage and a second supply voltage; and
pulling a control voltage in the switching output stage by a pulling circuit in response to a determination that the output signal exceeds a predetermined threshold;
wherein a pulling strength of the pulling circuit is proportional to a difference between the output signal and the predetermined threshold.

23. The method of claim 22, wherein pulling further comprises pulling the control voltage of a first switching device in the switching output stage to reduce the impedance of the first switching device in response to a determination that the output signal at the common output node is above a predetermined voltage and in response to a determination that the input signal indicates that output signal is changing from low to high.

24. The method of claim 22, wherein pulling further comprises pulling the control voltage of a first switching device in the switching output stage to reduce the impedance of the first switching device in response to a determination that the output signal at the common output node is below a predetermined voltage and in response to a determination that input signal indicates that output signal is changing from low to high.

25. The method of claim 22, wherein pulling further comprises pulling the control voltage of a second switching device in the switching output stage to reduce the impedance of the second switching device in response to a determination that the output signal at the common output node is above a predetermined voltage, and in response to a determination that the input signal indicates that output signal is changing from high to low.

26. The method of claim 22, wherein pulling further comprises pulling the control voltage of a second switching device in the switching output stage to reduce the impedance of the second switching device in response to a determination that the output signal at the common output node is below a predetermined voltage, and in response to a determination that the input signal indicates that output signal is changing from high to low.

27. The method of claim 22, wherein the switching output stage comprises a first switching device that is a PMOS transistor, and the control voltage is at a gate node of the PMOS transistor.

28. The method of claim 27, wherein the switching output stage comprises a second switching device that is a NMOS transistor and the control voltage is at the gate node of the NMOS transistor.

29. The method of claim 22, wherein the switching output stage comprises a first switching device that is a NMOS transistor, and the control voltage is at a gate node of the NMOS transistor.

30. The method of claim 29, wherein the switching output stage comprises a the second switching device that is a NMOS transistor and the control voltage is at the gate node of that NMOS transistor.

* * * * *